US005596288A

United States Patent [19]
Simmons et al.

[11] Patent Number: 5,596,288
[45] Date of Patent: *Jan. 21, 1997

[54] STATUS REGISTER WITH ASYNCHRONOUS READ AND RESET AND METHOD FOR PROVIDING SAME

[75] Inventors: Laura E. Simmons, Tempe; Joseph A. Thomsen, Chandler, both of Ariz.

[73] Assignee: VLSI Technology, Inc., San Jose, Calif.

[*] Notice: The term of this patent shall not extend beyond the expiration date of Pat. No. 5,233,617.

[21] Appl. No.: 526,119

[22] Filed: Sep. 7, 1995

Related U.S. Application Data

[63] Continuation of Ser. No. 86,339, Jun. 30, 1993, Pat. No. 5,493,242.

[51] Int. Cl.$^6$ .................................................. H03K 5/22
[52] U.S. Cl. ........................... 327/12; 327/142; 327/163; 327/193
[58] Field of Search ........................... 327/12, 142, 155, 327/159, 163, 198, 199, 225, 141; 326/93; 371/61

[56] References Cited

U.S. PATENT DOCUMENTS

| | | | |
|---|---|---|---|
| 3,555,255 | 1/1971 | Toy | 235/153 |
| 3,714,463 | 1/1973 | Laune | 307/232 |
| 3,950,705 | 4/1976 | Fuerherm | 328/108 |
| 4,039,960 | 8/1977 | Clark | 327/163 |
| 4,700,084 | 10/1987 | Honaker, Jr. | 307/269 |
| 4,876,701 | 10/1989 | Sanner | 375/106 |
| 4,999,528 | 3/1991 | Keech | 307/279 |
| 5,012,127 | 4/1991 | Gates et al. | 327/142 |
| 5,038,059 | 8/1991 | Ebzery et al. | 307/518 |
| 5,045,715 | 9/1991 | Fitch | 327/163 |
| 5,233,617 | 8/1993 | Simmons et al. | 371/61 |
| 5,264,802 | 11/1993 | Beg et al. | 328/133 |
| 5,266,851 | 11/1993 | Nukui | 307/514 |
| 5,309,037 | 5/1994 | Curley et al. | 327/142 |
| 5,410,550 | 4/1995 | Simmons et al. | 327/198 |

FOREIGN PATENT DOCUMENTS

| | | |
|---|---|---|
| 0402736A2 | 12/1990 | European Pat. Off. . |
| 6427850 | 1/1989 | Japan . |

OTHER PUBLICATIONS

Millman, Jacob et al., Articles on bistable latches and various type Flip–Flops, McGraw–Hill Company, 1987 no month.

Stone, Harold S., Articles on asynchronous timing difficulties, Microcomputer Iterfacing, Addison–Wesley Publishing Company, Feb. 1983, pp. 107–109.

Primary Examiner—Timothy P. Callahan
Assistant Examiner—My-Trang Nu Ton
Attorney, Agent, or Firm—Hickman Beyer & Weaver

[57] ABSTRACT

A single bit status register includes an input flip-flop, an asynchronous latch having an input coupled to an output of the input flip-flop, a comparator for comparing the outputs of the flip-flop and the latch, and an output stage which provides an error output when the comparator determines that the outputs of the flip-flop and the latch are not the same. In this fashion, it is known when a "read" of the status register is invalid due to the presence of the error output. Preferably, the register also includes a reset disabling mechanism which prevents the input flip-flop from being reset until a valid read has occurred. A n-bit status register includes n register sections, where each register section includes an input flip-flop, an asynchronous latch having an input coupled to an output of the input flip-flop, and a register section comparison mechanism for comparing the outputs of the flip-flop and the latch in that register section. The method of the present invention includes the steps of: a) capturing a status bit in an input flip; b) latching the status bit into an output latch; c) asynchronously enabling the output latch; d) comparing the outputs of the flip-flop and the latch; e) outputting an error signal if the outputs of the flip-flop and the latch are different; and f) outputting the status bit at least if the output of the flip-flop and the latch are the same.

52 Claims, 4 Drawing Sheets

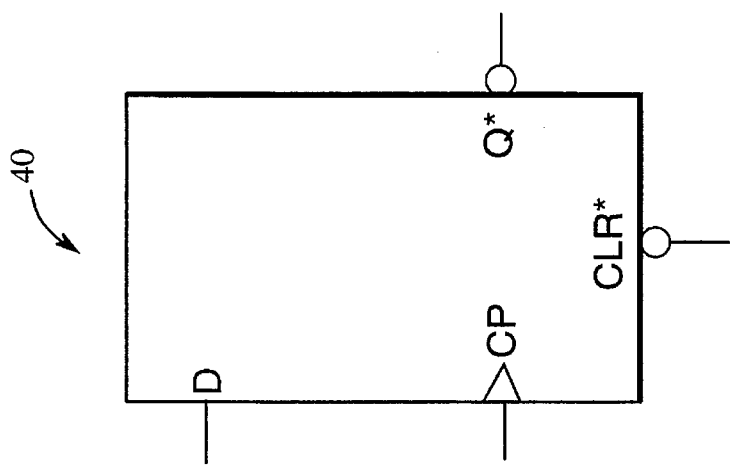
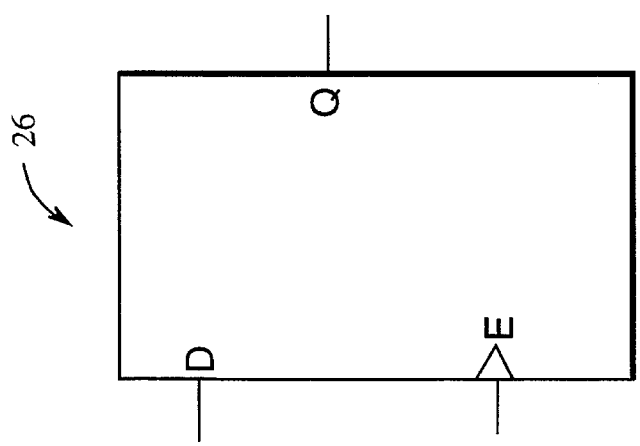
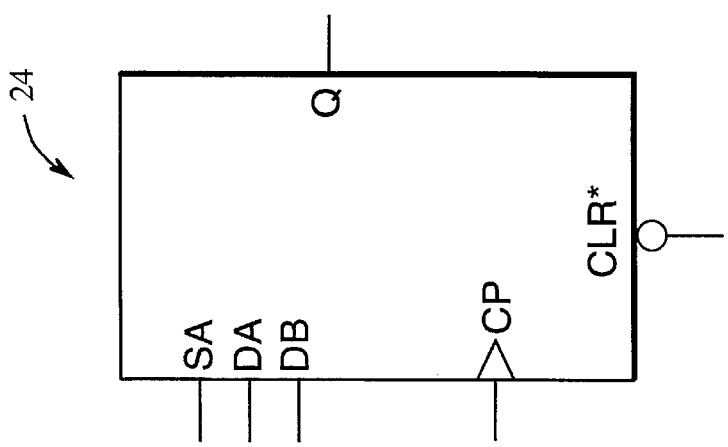

STATUS REGISTER WITH ASYNCHRONOUS READ AND RESET AND METHOD FOR PROVIDING SAME

This is a continuation of application Ser. No. 08/086,339 filed on Jun. 30, 1993, now U.S. Pat. No. 5,493,242.

BACKGROUND OF THE INVENTION

This invention relates generally to digital electronic circuits and more particularly to status registers having asynchronous resets.

The majority of operations within a digital electronic circuit are synchronous: i.e. the various gates, flip-flops, registers, etc. within the circuit are synchronized by clock pulses generated by a master clock. This synchronization minimizes problems caused by the inherent delay of signals as they flow through the circuit by ensuring that the appropriate input signals are present before a circuit element is activated.

Asynchronous operation occurs when various elements within a circuit are not synchronized to the same clock. As noted in *Microcomputer Interfacing,* Harold S. Stone, Addison-Wesley Publishing Company, 1983, pp. 108, the only way to be sure that a system is free from clocking difficulties is to use a single master clock from which all other timing is derived. Therefore, asynchronous operation is inherently subject to clocking errors which must be detected and hopefully remedied to ensure the proper operation of the asynchronous circuitry.

An example of a circuit which may exhibit problems associated with asynchronous operation is the conditional status register. A typical asynchronous conditional status register includes a number of input flip-flops which can capture data corresponding to various states within a digital circuit. For example, a particular input flip-flop could be triggered when a particular function within the digital has been completed. The outputs of the input flip-flops are coupled to the inputs of asynchronous output latches and (hopefully) reflect the values of the input flip-flops. However, since the output latches are enabled in an asynchronous fashion (such as by a user request for the values stored in the status register), the values stored in the output latches may not be the same as the values stored in the input flip-flops. This is because it takes a finite time for a signal from the output of a flip-flop to be latched into a corresponding latch. Since the latches are read asynchronously, recent flip-flop values may not yet have been latched into the output latches, in a phenomenon known as a "race condition." In a race condition, data from the flip-flop has not yet traveled to the data input of the latch at the time of the latch enable. This can result in an erroneous "read" of the status register, with possibly dire consequences to the proper operation of the digital system.

In U.S. Pat. No. 5,038,059 of Ebzery et al., a two-stage binary status register is set and reset by independent signals. The status register includes a first stage set-reset (SR) flip-flop, the output of which is connected to a second stage latch circuit. The set signals and reset signals are applied to the two stages in a manner which ensures that the output of the second stage latch always supplies an output corresponding to each set input signal, irrespective of the times of arrival of the set and reset signals, including all conditions of signal overlap and simultaneous arrival of both the set and reset signals.

Ebzery et al. resolve ambiguity problems by setting their status register to a known state in the event of a conflict. This known state is a default which, preferably, is the most common state for the register. While this reduces the problem of erroneous reads, it does not completely eliminate the possibility of the reading of erroneous data from the status register. Furthermore, Ebzery et al. do not provide a method or apparatus for alerting a system to a possible error condition caused by conflicts within the status register.

SUMMARY OF THE INVENTION

The present invention prevents incorrect data from being read from a status register due to asynchronous anomalies caused by race conditions, etc. An error signal is provided by the status register if an asynchronous error is present, and the status register is prevented from resetting until the register has been properly read.

A single-bit status register of the present invention includes an input flip-flop, an asynchronous latch having an input coupled to an output of the input flip-flop, a comparator which compares the outputs of the input flip-flop and the latch and outputting a comparison output, and an output stage coupled to the comparator which provides an error output when the output of the input flip-flop and the output of the latch are not the same. The comparator is preferably an exclusive OR (XOR)gate or an exclusive NOR (XNOR) gate which outputs a first logical state if the outputs of the flip-flop and the latch are the same, and a second logical state if the outputs of the flip-flop and the latch are different. If the outputs are different, it is known that the data held in the latch may be in error, and the error output signal is developed. This error signal can take the form of forcing the output of the register to a known state (e.g. to zero), or a separate error bit or flag can be set in the register.

The single-bit status register also preferably includes a reset disabling mechanism which prevents the flip-flop from being reset before a valid read of the register has taken place. The reset disabling mechanism preferably takes the form of a reset flip-flop which has a clock input coupled to a read request input and a data input coupled to the comparison output. The output of the reset flip-flop is coupled to the reset input of the input flip-flop. As long as there is an error signal at the comparison output, the reset flip-flop will prevent the input flip-flop from resetting.

A preferred embodiment of the status register of the present invention has multiple sections, i.e. the status register has n output bits, where n>2. In this preferred embodiment, the status register comprises n register sections, each of which includes an input flip-flop, an asynchronous latch having an input coupled to an output of the input flip-flop, and a register section comparator which compares the outputs of the flip-flop and the latch. The n bit status register further includes a collecting mechanism for collecting the comparison outputs of each of the n register sections and for producing a collective comparison output, and an output stage coupled to the collective comparison output for providing an error output when the output of an input flip-flop is different from an output of a latch for at least one of the n register sections.

As was the case with the single-bit status register, the register section comparator is preferably an exclusive OR (XOR) gate or an exclusive NOR (XNOR) gate. The collecting mechanism can comprise a logical AND gate having inputs coupled to the comparison outputs of each of the n register sections. The n bit status register also preferably has a reset disabling mechanism for disabling the resets of the input flip-flops of the n register sections if there has not been a valid read of the n bits of data.

A method for providing a status output in accordance with the present invention includes the steps of: a) capturing a status bit in an input flip-flop; b) asynchronously latching the status bit into an output latch; c) asynchronously enabling the output latch; d) comparing the output of the input flip-flop against the output of the latch; d) outputting an error signal if the output of the input flip-flop and the output of the output latch are different; and e) outputting the status bit at least if said output of said input flip-flop and said output of said output latch are the same. Preferably, the method also includes the step of disabling a reset of the input flip-flop. if the output of the input flip-flop and the output of the output latch are different.

These and other advantages of the present invention will become apparent upon reading the following detailed descriptions and studying the various figures of the drawings.

BRIEF DESCRIPTION OF THE DRAWINGS

FIGS. 2a–2c illustrate components of the schematic diagram of FIG. 1 in greater detail;

DETAILED DESCRIPTION OF THE PREFERRED EMBODIMENTS

Figure 1:
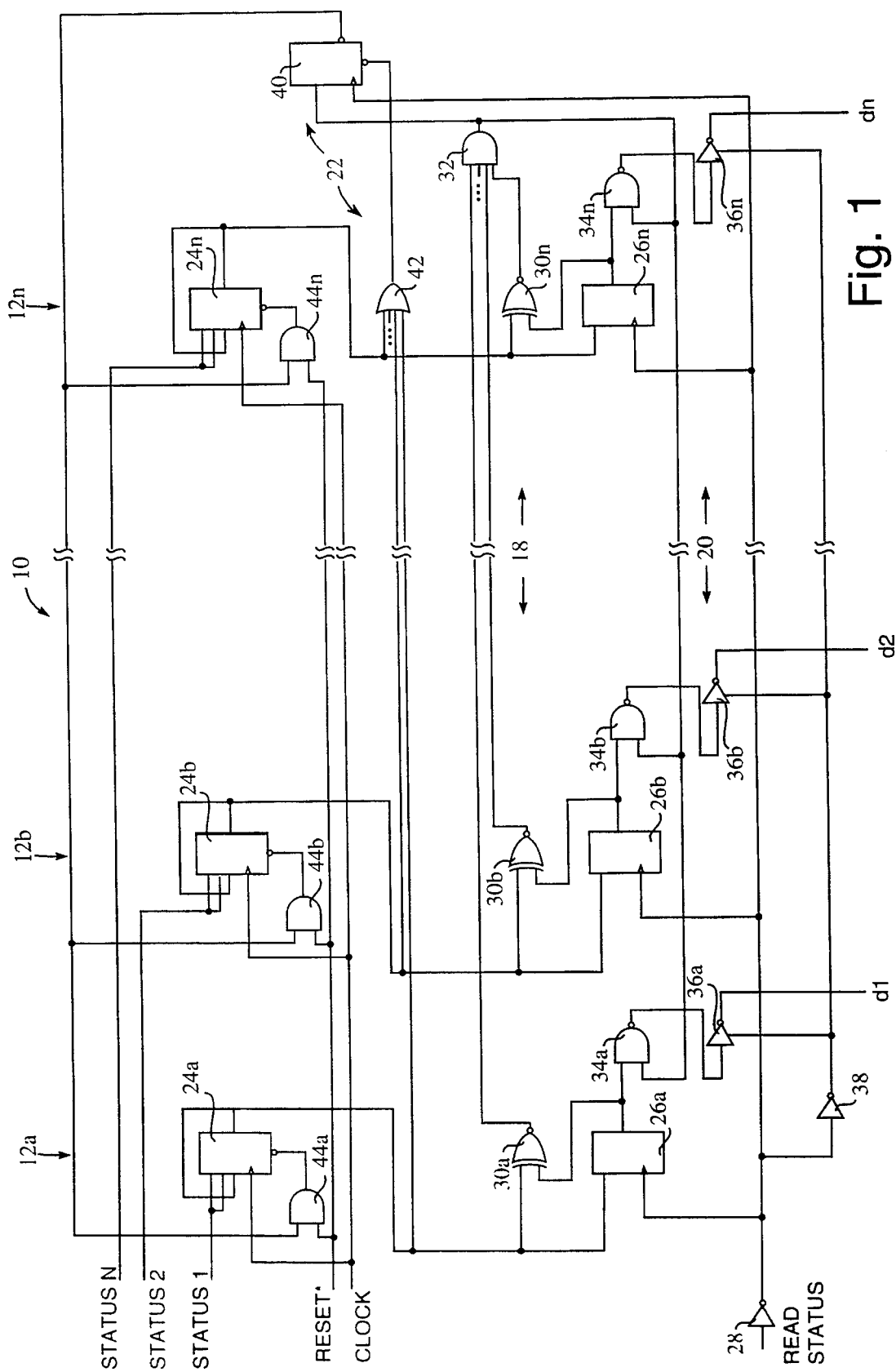
FIG. 1 is a schematic diagram of a first embodiment of a status register in accordance with the present invention.

In FIG. 1, a status register 10 in accordance with the present invention includes a first register section 12a, a second register section 12b, a $n^{th}$ register section 12n. Intermixed with the register sections 12a–12n is comparison circuitry 18, output circuitry 20, and reset disabling circuitry 22. The status register has, as inputs, n "status" lines, labeled here "STATUS 1", "STATUS 2", . . . , "STATUS N". The status register 10 also has, as inputs, a RESET* line, a CLOCK line, and a READ STATUS line. As used herein throughout this specification, and asterisk ("*") after a label indicates inversion. The status register 10 has, as output, n data lines labeled d1, d2, . . . , dn.

A single status register section 12a will be described, it being understood that the construction and operation of the other status register sections 12b and 12n are essentially the same. Alternatively, a single status register section, such as status register section 12a, can comprise the entire status register 10, i.e. n=1. With a single status register section, the status register 10 would be a one-bit register. Of course, a large number of status register sections can also be linked together to form a status register 10 of a desired length, e.g. 8 bits wide, 10 bits wide, 12 n bits wide, etc.

Status register section 12a includes an input flip-flop 24a and an output latch 26a. The distinction between a flip-flop 24a and a latch 26a, as is well known to those skilled in the art, is that a flip-flop is edge triggered and a latch is level triggered.

The particular flip-flop 24a and output latch 26a configurations used in the present invention will be discussed with additional reference to FIGS. 2a and 2b. Of course, other flip-flop and latch configurations are also suitable for use in the present invention. More particularly, the flip-flop 24a and output latch 26a are preferably constructed from an Application Specific Integrated Circuit (ASIC) cell library which includes a number of flip-flop and latch designs. The ASIC cell library used to construct the flip-flops and latches of the present invention is preferably a VLSI Technology, Inc. portable cell library such as portable cell library VSC450, which may be publicly accessed at VLSI Technology Design centers. Alternatively, the flip-flops, latches, and other components of the status register 10 can be made from discrete components or by other integrated circuit technologies.

In FIG. 2a, a flip-flop 24a has a at least five inputs, namely, SA, DA, DB, CP, and CLR*. The flip-flop 24a has at least one output Q. The SA input is for "Data Select", while the DA input and the DB input stand for "Data Input A" and "Data Input B", respectively. The CP input is for the clock input to the flip-flop 24a. As mentioned previously, the flip-flop 24a is an edge triggered device, which in this case is triggered on the rising edge. The CLR* input is used to reset the flip-flop 24a, i.e. when a logical low (LO) is developed at the CLR* input, the Q output is forced LO. The Q output represents the data state of the flip-flop 24a.

In FIG. 2b, latch 26a has at least two inputs, namely, a D and an E input, and at least one output, namely a Q output. The D input is the input for data into the latch, while the E input is the enable input to the latch. Again, the latch 26a is level activated such that the data on the D input is latched into the latch 26a when the level at on the enable input E reaches a certain level. In this instance, the latch 26a is enabled when the signal input is a logical high (HI). The Q output reflects the logical state stored in the latch 26a.

It should be noted that while the flip-flop 24a is a synchronous device, i.e. that it is clocked by a clock signal derived from the system clock, that the latch 26a is an asynchronous device. In other words, the enable line E can be activated at any time and thus is almost certainly not synchronized with the system clock. As those skilled in the art will soon appreciate, the method and apparatus of the present invention ensures that valid data is read from the status register 10 even with an asynchronous strobe of the output latch 24a.

Referring again to FIG. 1, the STATUS 1 line is coupled to both the SA and DA inputs of flip-flop 24a. The SA input is a multiplex control input which selects the DA input for data input to the flip-flop when SA is HI, and which selects the DB input for data input to the flip-flop when SA is LO. Therefore, the flip-flops 24a–24n are preferably flip-flops with multiplexed inputs (DA and DB) controlled by the SA input. Therefore, when the input on DA is HI, the DA port is selected, and when the input on DA is LO, the DB input is selected. The DB input is coupled to the Q output, and the CP input is coupled to the CLOCK line of the status register 10. The effect of this arrangement is to capture and hold a status bit corresponding to the status on the STATUS 1 line. For example, if the logical level on STATUS 1 is HI, on the next rising edge of the clock, that value will be clocked into the flip-flop 24a and the output level on the Q output will be HI. The HI logical level if fed back to the DB input, such that every additional rising edge of the clock will simply re-clock the HI level into the flip-flop 24a. In this way, once the flip-flop has been set, the value at the Q output will remain HI until the flip-flop is reset by a LO logical level input into the CLR* input of the flip-flop. Also, the Q output of the flip-flop 24a will remain LO as long as the STATUS 1 input is LO after reset.

The Q output of the flip-flop 24a is coupled to the D input of the latch 26a. The READ STATUS line is coupled to the E input of the output latch 26a by an inverter 28. Thus, when the logical level of READ STATUS is LO, a logical HI level will be input to the E input of the latch 26a, thereby enabling the latch to follow the data at the D input. When READ STATUS is HI, the latch latches the last logical state at the D input into the latch. In other words, the latches 26a–26n are active HI latches, such that when the E input is HI, the logical value at the Q output follows the logical value at the D input, and such that when the E input is LO, the logical value at the Q output is latched to the last value at the D input to the latch.

A problem known as a race condition can occur when new data has been synchronously clocked into the flip-flop 24a and then an asynchronous READ STATUS request is made. This occurs when the rising edges of CLOCK and READ STATUS occur at about the same time. This can cause the latch 26a to latch onto the previous Q output of the flip-flop 24a rather than the new Q output of the flip-flop, resulting in different logical state values being stored in the flip-flop 24a and the latch 26a. Any subsequent read of the latch 26a would then be in error, i.e. the data on data output d1 would be in error. It is this problem that the method and apparatus of the present invention solves.

The remaining register sections 12b and 12n operate in substantially the same manner as register section 12a. In register section 12b, a flip-flop 24b is coupled to a STATUS 2 line in the same fashion that flip-flop 24a was coupled to the STATUS 1 line. The Q output and DB input are coupled together to capture and hold the status on the status line 2 as described previously. Flip-flop 24b is clocked by the same clock as flip-flop 24a. Latch 26b is coupled to the flip-flop 24b in the same fashion that latch 26a is coupled to flip-flop 24a. Latch 26b is enabled by the same inverted "READ STATUS" line that enables the latch 26a.

For any arbitrary register section n (such as register section 12n) a flip-flop 24n is coupled to a STATUS N line in the same fashion that flip-flop 24a was coupled to the STATUS 1 line. The Q output and DB input of flip-flop 24n are coupled together to capture and hold the status on the status line n as described previously with regards to register section 12a. Flip-flop 24n is clocked by the same clock as flip-flop 24a. Latch 26n is coupled to the flip-flop 24n in the same fashion that latch 26a is coupled to flip-flop 24a. Latch 26n is enabled by the same inverted "READ STATUS" line that enables the latch 26a.

Since any one of the register sections can be subject to a race condition which latches incorrect data into the output latch, comparison circuitry (comparator) 18 is provided to check each register section for errors. More particularly, in this embodiment of FIG. 1, comparison circuitry 18 includes a number of exclusive NOR (XNOR) gates 30a, 30b, ..., 30n and an AND gate 32. Each of the XNOR gates 30, 30b, ..., 30n is associated with one of the register sections, e.g. with register sections 12a, 12b, and 12n in this example. A first input of XNOR gate 30a is coupled to the Q output of flip-flop 24a and a second input of XNOR gate 30 is coupled to the Q output of output latch 26a. In this way, XNOR gate 30a "compares" the outputs of the flip-flop 24a and latch 26a to determine if they are the same. The same comparison is made of flip-flop 24b and latch 26b by XNOR gate 30b, and of flip-flop 24n and latch 26n by XNOR gate 30n. This comparison is generically summarized below:

TABLE ONE

| Q Output of Flip-Flop 24 | Q Output of Latch 26 | Output of XNOR 30 |
|---|---|---|
| LO | LO | HI |
| LO | HI | LO |
| HI | LO | LO |
| HI | HI | HI |

As can be seen in Table One, the output of an XNOR 30 is HI when the outputs of its associated flip-flop 24 and latch 26 are the same, and the output of an XNOR 30 is LO when the outputs of its associated flip-flop 24 and latch 26 are different. Since the outputs of the XNOR gates 30a, 30b, ..., 30n are all input into AND gate 32, the output of AND gate 32 will be LO if any one of the outputs of the XNOR gates is LO, and will be HI if all of the outputs of the XNOR gates are HI. In other words, the output of AND gate 32 will only be HI if the data in all of the latches 26 matches the data in the corresponding flip-flops 24. Therefore, the output of the AND gate 32 indicates that there is an error in the data in the latches 26 with a LO logical value, and indicates that there is not any error in the data in the latches 26 with a HI logical value.

It should be noted that while, in this preferred embodiment, that XNOR gates are used as part of the comparison circuit 18, exclusive OR gates (XOR) gates can also be used for this purpose. When using XOR gates, the logic is essentially inverted, and a NOR gate would be used in place of the AND gate. A logical LO from the NOR gate would indicate a lack of error in the data in the latches, and a logical HI from the NOR gate would indicate error in the data of at least one of the latches. Therefore, as used herein, the exclusive OR function can include either XOR or XNOR gates.

In the embodiment of FIG. 1, the output circuitry 20 includes a number of NAND gates 34a, 34b ..., 34n and a number of three-state buffers 36a, 36b, ..., 36n. NAND gate 34a and three-state buffer 36a are associated with register section 12a, NAND gate 34b and three-state buffer 36b are associated with register section 12b, and NAND gate 26n and three-state buffer 36n are associated with register section 12n. Again, since the operation of register sections 12a–12c is essentially the same, we will discuss the operation of the output circuitry 20 in terms of the operation of register section 12a, it being understood that it operates in the same fashion in registers 12b and 12c.

A first input of NAND gate 34a is coupled to the Q output of latch 26a, and a second input of NAND gate 34a is coupled to the output of AND gate 32. The output of NAND gate 34a is coupled to the input of three-state buffer 36a. The inverted output of the three-state buffer 36a is coupled to the data output line d1. The control input of the threestate buffer 36a is coupled to the output of inverter 28 by an inverter 38. When the READ STATUS input is HI, the three-state buffer is activated and the data on output line d1 is inverse of the data on the output of NAND gate 34a. When the READ STATUS input is LO, the three-state buffer 36 is deactivated, and the output on line d1 is allowed to float, i.e. to enter a third, indeterminate "state."

When the three-state buffer is activated by a "READ STATUS" signal, the output on line d1 is the inverse of the output of NAND gate 34a. However, when an error condition is detected by comparison circuitry 18, the output of AND gate 21 is forced LO, which forces the output of NAND gate 34a HI regardless of the value at the Q output of latch 26a. This, in turn, forces the output on line d1 to LO. Since all of the register sections 12 operate in essentially the same fashion, all n of the data outputs d, i.e. d1, d2, . . . , dn are forced LO. By forcing the data outputs to a known state (in this case all LO states) an error output is created which informs the system that there is an error in at least one of the register sections 12. The system therefore can detect an error condition by detecting when all of the data outputs d1, d2, . . . , dn are LO. Alternatively, an error condition could be signaled by setting all of the data outputs to HI, or to some other pattern. If an error condition is sensed upon a read cycle, the system would know that it does not have valid data and would re-read the status register 10 after some period of time has elapsed to allow a settling of the status register and the resolution of any race conditions. If there is no error condition, i.e. if the output of AND gate 32 is HI, and if the READ STATUS line is activated (HI), then the outputs on the data lines d1, d2, . . . , dn are the same as the Q outputs of their respective latches 26a, 26b, . . . , 26n.

The comparison circuitry 18 and output circuitry 20 therefore have the very important task of detecting errors and creating an error signal for the system. The output circuitry 20 also has the task of outputting valid data for the status register 10. The comparison circuitry 18 is also used for an important secondary task: preventing the input flip-flops 24a, 24b, . . . , 24n from being reset before a valid read of the status register has been made. This is the primary function of the reset disabling circuitry 22 of FIG. 1.

The reset disabling circuitry 22 includes a reset flip-flop 40 which is shown in greater detail in FIG. 2c. The reset flip-flop is again preferably made from a standard cell library, such as one of the aforementioned VLSI Technology, Inc. portable standard cell libraries. Alternatively, the reset flip-flop can be implemented in discrete circuitry or other integrated circuit technologies. The reset flip-flop 40 has a data input D, a clock input CP, a reset input CLR*, and a Q* output which reflects the inverse of the logical state stored within the flip-flop 40. Referring again to FIG. 1, the reset flip-flop 40 has its D input coupled to the output of the AND gate 32, its CP input coupled to the output of the inverter 28, its CLR* input coupled to the output of an OR gate 42. and its Q* output coupled to a number of AND gates 44a, 44b, . . . , 44n associated with input flip-flops 24a, 24b, . . . , 24n. Reset flip-flop is clocked by a rising edge of a signal developed at the output of inverter 28 by the falling edge of a READ STATUS signal. When the output of AND gate 32 is HI (indicating that there are no error conditions in the register sections 12a–12n), a HI logical state is clocked into the reset flip-flop. This produces a LO logical state at the Q* output of the reset flip-flop, which forces the outputs of the outputs of the AND gates 44a 44n LO, resetting the input flip-flops 24a–24n. If, on the other hand, the output of AND gate 32 is LO, indicating an error in at least one of the register sections 12a, 12b, . . . , 12n, a LO state is clocked into the reset flip-flop 40 by the rising edge of the READ STATUS input to inverter 28, causing the Q* output of reset flip-flop 40 to go HI. This creates a HI input at one of the inputs of the AND gates 44a–44n. The other input of the AND gates 44a–44n are coupled to a status register reset line RESET*, which is normally HI. Therefore, when an error is detected by the comparison circuit 18, and in the absence of a system reset, the AND gates 44a, 44b . . . , 44n have HI logical outputs, and the flip-flops are prevented from resetting. All flip-flops 44a–44n can be reset by the system, regardless of the error state, by setting the RESET* input line to LO.

It will be recalled that a HI logical state in the reset flip-flop 40 causes the input flip-flops 24a–24n to reset. However, the reset flip-flop 40 is still at a logical HI state. To reset the reset flip-flop 40 to a low logical state, OR gate 42 has inputs coupled to the Q outputs of each of the input flip-flops 24a–24n. If any one of the Q outputs of input flip-flops 24a–24n is HI, then the flip-flops have not been reset, and the output of OR gate 42 is HI. This condition will not reset the reset flip-flop 40. If, however, all of the Q outputs of the input flip-flops 24a–24n are at a LO logical state, the input flip-flops are in a reset condition, the output of OR gate 42 is LO, and the reset flip-flop is reset such that it stores a LO logical state.

The effect of the reset disabling circuitry 22 is to allow a reset of the input flip-flops 24a–24n only after a valid read of the output latches 26a–26n has been made by the system. This ensures that data clocked into the input flip-flops 24a–24n is not cleared before corresponding valid data has been read from the output latches 26a–26n. Once that valid data has been read, the disabling circuitry 22 permits the input flip-flops to be cleared to await new status information on lines STATUS 1–STATUS N.

Figure 3:
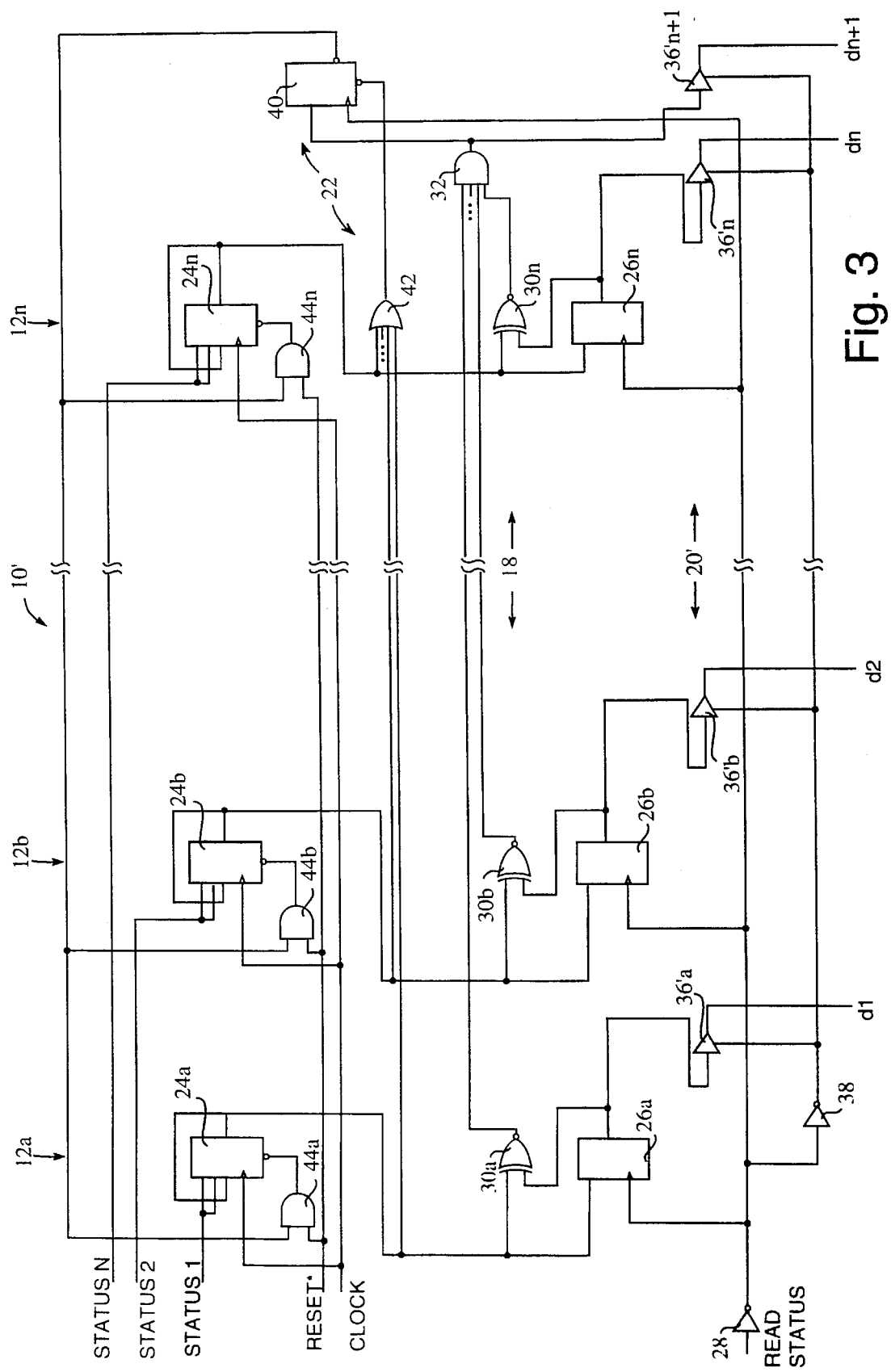
FIG. 3 is a schematic diagram of a second embodiment of a status register in accordance with the present invention.

FIG. 3 illustrates an alternate embodiment of a status register 10' in accordance with the present invention. In many ways, the status register 10' is manufactured and operates in a similar manner to the status register 10 of FIG. 1, and like sections and components of the status register 10' will be referenced with the same reference numerals as the status register 10 of FIG. 1. The essential difference between status register 10' (FIG. 3) and status register 10 (FIG. 1 ) is that the output circuitry 20' of status register 10' is different from the output circuitry 20 of status register 10. Other than that, the register sections 12a–12n, the comparison circuitry 18, and the reset disabling circuitry 22 operated for status register 10' the same way that they did for status register 10.

The output circuitry 20' does not include the NAND gates 34a–34n of FIG. 1. The Q outputs of the output latches 26a–26n of status register 10' are coupled directly to the inputs of three-state buffers 36'a–36'n, respectively. An additional three-state buffer 36'n+1 is added with its control input coupled to the output of inverter 38. The input of the three-state buffer 36'n+1 is coupled to the output of AND gate 32, and the output of threestate buffer 36'n+1 is coupled to an additional output data line dn+1. It should be noted that three-state buffers 36'a–36'n are non-inverting three-state buffers, in contrast to the inverting three-state buffers 36a–36n described previously.

In the event that an error is detected by comparison circuit 18, i.e. the output of AND gate 32 is LO, a HI logical state is be developed at dn+1 when the READ STATUS line is HI. Alternatively, if the output of AND gate 32 is HI (indicating no error), a LO logical state is be developed at dn+1 when the READ STATUS line is HI. Therefore, output dn+1 can be used as an error bit by the system to determine whether the data at data outputs d1–dn is valid. If the data is valid as indicated by the error bit, the status register 10' can be read again after waiting a suitable period of time.

Figure 4:
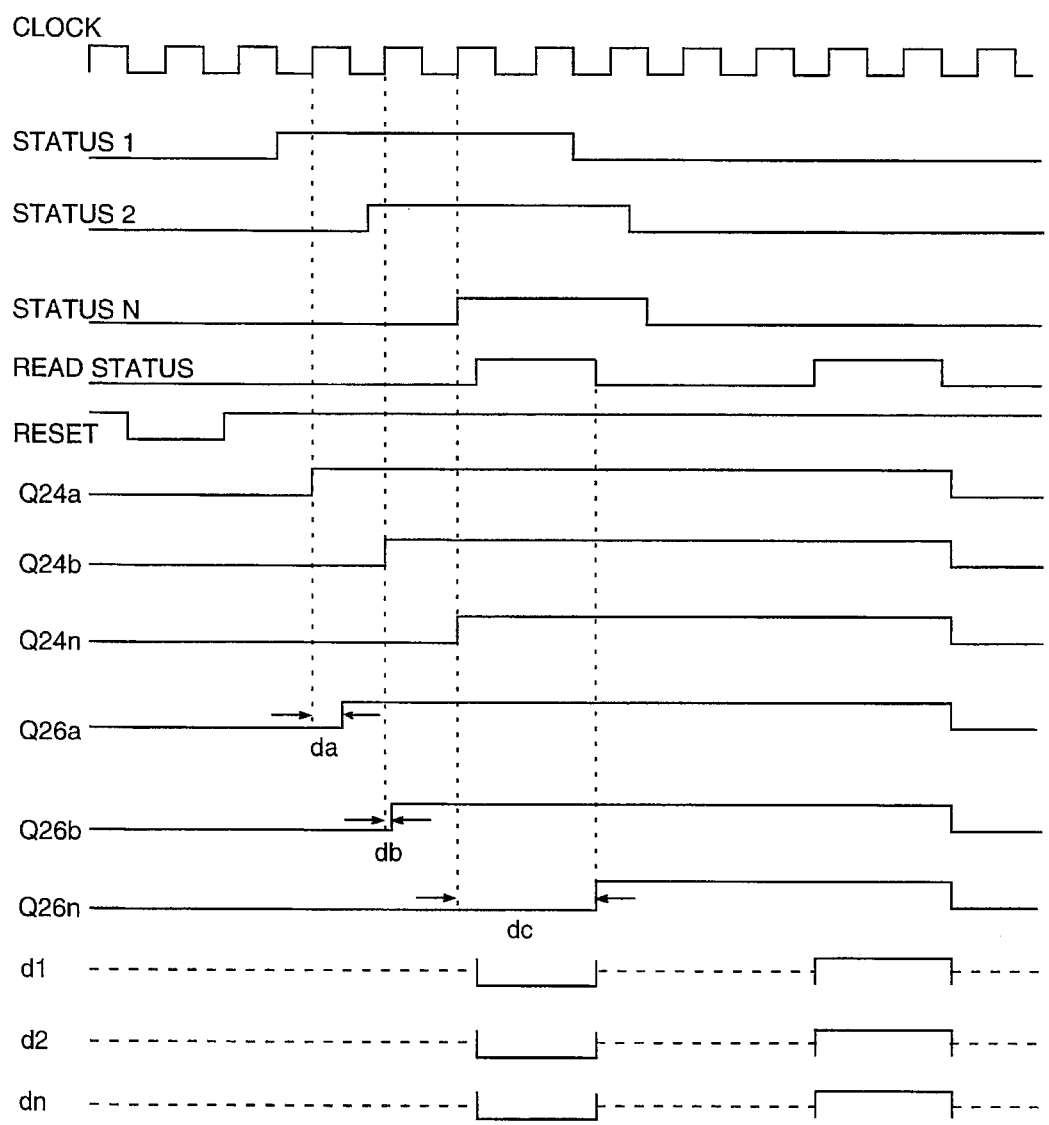
FIG. 4 is a timing diagram illustrating the operation of a status register of FIG. 1.

FIG. 4 is a timing diagram illustrating the operation of status register 10 of FIG. 1. Status register 10' of FIG. 3 operates in a similar manner, except that the d1, d2, . . . , dn outputs reflect the actual (erroneous) outputs of the latches even when an error is detected, and an output error bit is set to warn the system of the error. As seen in FIG. 4, when STATUS 1 goes high for at least one CLOCK cycle, it is clocked by the rising edge of CLOCK into input flip-flop 24a. The Q output of flip-flop 24a (Q 24a) then goes HI. When STATUS 2 goes HI, it is clocked into flip-flop 24b on the next rising edge of CLOCK such that the Q output of flip-flop 24b (Q 24b) goes HI. When STATUS N goes HI, the next rising clock edge of CLOCK clocks a HI into flip-flop 24n, causing the Q output of flip-flop 24n (Q 24n) to go HI.

At some variable time after data is clocked into the input flip-flops, it becomes input into the latches 26a–26n due to the LO logical state of the READ STATUS line. For example, after a time da, the Q output of flip-flop 24a shows up at the Q output of output latch 26a (Q 26a). In a similar fashion, the Q output of flip-flop 24b shows up at the Q output of output latch 26b (Q 26b) after a time db, and the Q output of flip-flop 24n shows up at the Q output of output latch 26n (Q 26n) after a time dn. The time dn is quite long because, in this example, READ STATUS went HI before the Q output of the flip-flop 24n could be input into the latch 26n.

It should be noted that the delay times da, db, ..., dn are greatly exaggerated for clarity. The delay times can vary due to the length of the conductive line coupling a particular flip-flop to a particular latch, the capacitance of the line, whether a READ STATUS request has just missed a new bit of information, etc.

Upon the first attempt to read the status register with a HI pulse at READ STATUS, Q 24a is the same state as Q 26a (i.e. HI), and Q 24b is the same state as Q 26b (i.e. HI), but Q 24n is not the same state as Q 26n. This results in an error signal produced by comparison circuit 18 to force all of data outputs LO during the duration of the HI READ STATUS pulse from the floating state indicated in broken lines. In other words, since the data in the input flip-flop 24n was not the same as the data in the output latch 26n, a valid read cannot be made of the status register 10 and all data outputs are forced low to indicate the error state. The output of the three-state buffers are then allowed to float again. On the second HI pulse of READ STATUS, the error signal indicates that there is no difference between the data stored in the input flip-flops and the output latches, and the data on the data lines d1, d2, ..., dn reflects the data in the output latches (all HI logical states in this example). After the HI pulse of READ STATUS is completed, the three-state buffers are again allowed to float.

While this invention has been described in terms of several preferred embodiments, there are alterations, permutations, and equivalents which fall within the scope of this invention. It is therefore intended that the following appended claims be interpreted as including all such alterations, permutations, and equivalents as fall within the true spirit and scope of the present invention.

What is claimed is:

1. A status register comprising:
    an input flip-flop having an input coupled to a status input and having an output, said input flip-flop being clocked by a clocking signal derived from a system clock;
    an asynchronous latch having an input coupled to said output of said input flip-flop and having an output, where said asynchronous latch is enabled asynchronously with respect to said system clock;
    a comparator coupled to said output of said input flip-flop and said output of said asynchronous latch and operative to produce a comparison output; and
    an output stage coupled to said comparison output to provide an error output when said output of said input flip-flop and said output of said asynchronous latch are different.

2. A status register as recited in claim 1 wherein said comparator includes a logical exclusive OR (XOR).

3. A status register as recited in claim 1 wherein said comparator includes a logical exclusive NOR (XNOR).

4. A status register as recited in claim 1 wherein said output stage is further coupled to said output of said asynchronous latch and is operative to provide an output reflecting said output of said asynchronous latch when said output of said input flip-flop and said output of said asynchronous latch are the same.

5. A status register as recited in claim 4 wherein said output stage comprises a logical NAND having a first input coupled to said output of said asynchronous latch, a second input coupled to said comparison output, and a logical NAND output.

6. A status register as recited in claim 5 wherein said output stage further comprises a three-state buffer having an input coupled to said logical NAND output.

7. A status register as recited in claim 4 wherein said output stage comprises error output means for providing said error output and data output means coupled to said output of said asynchronous latch and operative to provide a status output for said status register.

8. A status register as recited in claim 7 wherein said error output means and said data output means operate independently.

9. A status register as recited in claim 1 wherein said input flip-flop further has a reset input, and wherein said status register further comprises a reset disabling mechanism coupled between said comparison output and said reset input of said input flip-flop and operative to prevent said input flip-flop from resetting when said output of said input flip-flop and said output of said asynchronous latch are different.

10. A status register as recited in claim 9 wherein said reset disabling mechanism includes a reset flip-flop having a clock input coupled to a read request input, a data input coupled to said comparison output, and an output coupled to said reset input of said input flip-flop.

11. A status register as recited in claim 10 wherein said reset disabling mechanism further includes a logical AND having a first input coupled to said output of said reset flip-flop and a second input coupled to a register reset input, and having an output coupled to said reset input of said input flip-flop, whereby a reset signal on said register reset input can reset said input flip-flop even when said output of said input flip-flop and said output of said asynchronous latch are different.

12. A status register as recited in claim 10 wherein said reset flip-flop includes a reset input, and wherein said reset input of said reset flip-flop is coupled to said output of said input flip-flop.

13. A status register comprising:
    (a) a plurality of register sections, each of which includes:
        (i) an input flip-flop having an input coupled to a status input and having an output, said input flip-flop being clocked by a clocking signal derived from a system clock;
        (ii) an asynchronous latch having an input coupled to said output of said input flip-flop and having an output, where said asynchronous latch is enabled asynchronously with respect to said system clock;
        (iii) a register section comparison mechanism coupled to said output of said input flip-flop and said output of said asynchronous latch and operative to produce a comparison output for said register section;
    (b) a collecting mechanism for collecting the comparison outputs of each of the plurality of register sections and producing a collective comparison output; and
    (c) an output stage coupled to said collective comparison output for providing an error output when said output of said input flip-flop and said output of said latch for at least one of said plurality of register sections are different.

14. A status register as recited in claim 13 wherein each of said register section comparison mechanisms includes a logical exclusive OR (XOR).

15. A status register as recited in claim 13 wherein each of said register section comparison mechanisms includes a logical exclusive NOR (XNOR).

16. A status register as recited in claim 13 wherein said output stage is further coupled to said outputs of said asynchronous latch of each of said register sections and is operative to provide a status register output when said output of said input flip-flop and said output of said asynchronous latch for each of said plurality of register sections is the same.

17. A status register as recited in claim 16 wherein said output stage comprises a plurality of logical NAND gates associated with said plurality of register sections, where for each register section said logical NAND gate has a first input coupled to said output of said asynchronous latch, a second input coupled to said collective comparison output, and a logical NAND output.

18. A status register as recited in claim 17 wherein said output stage further comprises a plurality of three-state buffers associated with said plurality of register sections, where each three-state buffer has an input coupled to said logical NAND output.

19. A status register as recited in claim 16 wherein said output stage comprises error output means for providing said error output and a plurality of data output means associated with said plurality of register sections, where each data output means is coupled to said output of said asynchronous latch and operative to provide a status output for said register section.

20. A status register as recited in claim 19 wherein said error output means and said plurality of data output means operate independently.

21. A status register as recited in claim 13 wherein, for each register section, said input flip-flop further has a reset input, and wherein said status register further comprises a reset disabling mechanism coupled between said collective comparison output and said reset input of each of said input flip-flops and is operative to prevent said plurality of input flip-flops from resetting when, for at least one register section, said output of said input flip-flop and said output of said asynchronous latch are different.

22. A status register as recited in claim 21 wherein said reset disabling mechanism includes a reset flip-flop having a clock input coupled to a read request input, a data input coupled to said collective comparison output, and an output coupled to said reset input of said input flip-flop of each of said register sections.

23. A status register as recited in claim 22 wherein said reset disabling mechanism further includes a plurality of logical AND gates associated with said plurality of register sections, where each logical AND gate has a first input coupled to said output of said reset flip-flop and a second input coupled to a register reset input, and having an output coupled to said reset input of said input flip-flop, whereby a reset signal on said register reset input can reset said input flip-flop even when said output of said input flip-flop and said output of said asynchronous latch are different.

24. A status register as recited in claim 22 wherein said reset flip-flop includes a reset input, and wherein said reset input of said reset flip-flop is coupled to said output of said input flip-flop of each of said register sections.

25. A status register as recited in claim 24 further comprising a logical OR gate having an input coupled to said output of said input flip-flop of each of said register sections, and having an output coupled to said reset input of said reset flip-flop.

26. A status register as recited in claim 13 wherein said collecting mechanism comprises a logical AND having inputs coupled to said comparison outputs of each of said plurality of register sections, and having an output coupled to said output stage.

27. A method for providing a status output comprising the steps of:

capturing a status bit in an input flip-flop;

latching said status bit into an output latch;

asynchronously enabling said output latch;

comparing an output of said input flip-flop against and output of said output latch;

outputting an error signal if said output of said input flip-flop and said output of said output latch are different;

outputting said status bit at least if said output of said input flip-flop and said output of said output latch are the same; and disabling a reset of said input flip,flop if said output of said input flip-flop and said output of said output latch are different.

28. A method for providing a status output as recited in claim 27 wherein both said error signal and said status bit are output in the event that both said output of said input flip-flop and said output of said output latch are different.

29. A method for providing a status output as recited in claim 27 wherein only one of said error signal and said status bit are output in the event that both said output of said input flip-flop and said output of said output latch are different.

30. A status register comprising:

an input flip-flop having an input coupled to a status input, and also having an output and a reset input, said input flip-flop being clocked by a clocking signal derived from a system clock;

an asynchronous latch having an input coupled to said output of said input flip-flop and having an output, where said asynchronous latch is enabled asynchronously with respect to said system clock;

a comparator coupled to said output of said input flip-flop and said output of said asynchronous latch and operative to produce a comparison output;

an output stage coupled to said comparison output to provide an error output when said output of said input flip-flop and said output of said asynchronous latch are different; and a reset disabling mechanism coupled between said comparison output and said reset input of said input flip-flop and operative to prevent said input flip-flop from resetting when said output of said input flip-flop and said output of said asynchronous latch are different.

31. A status register as recited in claim 30 wherein said comparator includes a logical exclusive OR (XOR).

32. A status register as recited in claim 30 wherein said comparator includes a logical exclusive NOR (XNOR).

33. A status register as recited in claim 30 wherein said output stage is further coupled to said output of said asynchronous latch and is operative to provide an output reflecting said output of said asynchronous latch when said output of said input flip-flop and said output of said asynchronous latch are the same.

34. A status register as recited in claim 33 wherein said output stage comprises a logical NAND having a first input coupled to said output of said asynchronous latch, a second input coupled to said comparison output, and a logical NAND output.

35. A status register as recited in claim 34 wherein said output stage further comprises a three-state buffer having an input coupled to said logical NAND output.

36. A status register as recited in claim 33 wherein said output stage comprises error output means for providing said error output and data output means coupled to said output of said asynchronous latch and operative to provide a status output for said status register.

37. A status register as recited in claim 36 wherein said error output means and said data output means operate independently.

38. A status register as recited in claim 37 wherein said reset disabling mechanism includes a reset flip-flop having a clock input coupled to a read request input, a data input coupled to said comparison output, and an output coupled to said reset input of said input flip-flop.

39. A status register as recited in claim 38 wherein said reset disabling mechanism further includes a logical AND having a first input coupled to said output of said reset flip-flop and a second input coupled to a register reset input, and having an output coupled to said reset input of said input flip-flop, whereby a reset signal on said register reset input can reset said input flip-flop even when said output of said input flip-flop and said output of said asynchronous latch are different.

40. A status register as recited in claim 38 wherein said reset flip-flop includes a reset input, and wherein said reset input of said reset flip-flop is coupled to said output of said input flip-flop.

41. A status register comprising:
  input flip-flop means having an input coupled to a status input and having an output, said input flip-flop means being clocked by a clocking signal derived from a system clock;
  asynchronous latch means having an input coupled to said output of said input flip-flop and having an output, where said asynchronous latch means is enabled asynchronously with respect to said system clock;
  comparison means coupled to said output of said input flip-flop means and said output of said asynchronous latch means and operative to produce a comparison output; and
  output means coupled to said comparison output to provide an error output when said output of said input flip-flop means and said output of said asynchronous latch means are different.

42. A status register as recited in claim 41 wherein said comparison means includes a logical exclusive OR (XOR) means.

43. A status register as recited in claim 41 wherein said comparison means includes a logical exclusive NOR (XNOR) means.

44. A status register as recited in claim 41 wherein said output means is further coupled to said output of said asynchronous latch means and is operative to provide an output reflecting said output of said asynchronous latch means when said output of said input flip-flop means and said output of said asynchronous latch means are the same.

45. A status register as recited in claim 44 wherein said output means comprises logical NAND means having a first input coupled to said output of said asynchronous latch means, a second input coupled to said comparison output, and a logical NAND output.

46. A status register as recited in claim 45 wherein said output means thrther comprises three-state buffer means having an input coupled to said logical NAND output.

47. A status register as recited in claim 44 wherein said output means comprises error output means for providing said error output and data output means coupled to said output of said asynchronous latch means and operative to provide a status output for said status register.

48. A status register as recited in claim 47 wherein said error output means and said data output means operate independently.

49. A status register as recited in claim 41 wherein said input flip-flop means further has a reset input, and wherein said status register further comprises reset disabling means coupled between said comparison output and said reset input of said input flip-flop means and operative to prevent said input flip-flop means from resetting when said output of said input flip-flop means and said output of said asynchronous latch means are different.

50. A status register as recited in claim 49 wherein said reset disabling means includes reset flip-flop means having a clock input coupled to a read request input, a data input coupled to said comparison output, and an output coupled to said reset input of said input flip-flop means.

51. A status register as recited in claim 50 wherein said reset disabling means further includes logical AND means having a first input coupled to said output of said reset flip-flop and a second input coupled to a register reset input, and having an output coupled to said reset input of said input flip-flop means, whereby a reset signal on said register reset input can reset said input flip-flop. means even when said output of said input flip-flop means and said output of said asynchronous latch means are different.

52. A status register as recited in claim 50 wherein said reset flip-flop includes a reset input, and wherein said reset input of said reset flip-flop is coupled to said output of said input flip-flop means.

* * * * *